(12) United States Patent
Aben et al.

(10) Patent No.: US 10,191,390 B2
(45) Date of Patent: Jan. 29, 2019

(54) METHOD FOR TRANSFERRING A MARK PATTERN TO A SUBSTRATE, A CALIBRATION METHOD, AND A LITHOGRAPHIC APPARATUS

(71) Applicant: ASML Netherlands B.V., Veldhoven (NL)

(72) Inventors: Paul Cornelis Hubertus Aben, Eindhoven (NL); Sanjaysingh Lalbahadoersing, Helmond (NL); Jurgen Johannes Henderikus Maria Schoonus, Nuenen (NL); David Frans Simon Deckers, Turnhout (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/578,312

(22) PCT Filed: Jun. 27, 2016

(86) PCT No.: PCT/EP2016/064892
§ 371 (c)(1),
(2) Date: Nov. 30, 2017

(87) PCT Pub. No.: WO2016/207445
PCT Pub. Date: Dec. 29, 2016

(65) Prior Publication Data
US 2018/0149981 A1  May 31, 2018

(30) Foreign Application Priority Data
Jun. 26, 2015 (EP) ..................................... 15174026

(51) Int. Cl.
*G03F 7/20* (2006.01)
*G03F 9/00* (2006.01)

(52) U.S. Cl.
CPC .......... *G03F 7/70516* (2013.01); *G03F 7/707* (2013.01); *G03F 7/70466* (2013.01);
(Continued)

(58) Field of Classification Search
CPC ............... G03F 7/70516; G03F 9/7019; G03F 7/70466; G03F 7/70633; G03F 7/70683; G03F 9/708
See application file for complete search history.

(56) References Cited

U.S. PATENT DOCUMENTS 9,715,181 B2  7/2017  Schmitt-Weaver et al.
2002/0102482 A1  8/2002  Smith et al.
(Continued)

OTHER PUBLICATIONS

International Search Report and Written Opinion dated Nov. 29, 2016 in corresponding International Patent Application No. PCT/EP2016/064892.

*Primary Examiner* — Steven Whitesell Gordon
(74) *Attorney, Agent, or Firm* — Pillsbury Winthrop Shaw Pittman LLP

(57) ABSTRACT

A method including: providing a reference substrate with a first mark pattern; providing the reference substrate with a first resist layer on the reference substrate, wherein the first resist layer has a minimal radiation dose needed for development of the first resist; using a reference patterning device to impart a radiation beam with a second mark pattern in its cross-section to form a patterned radiation beam; and exposing a target portion of the first resist layer of the reference substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two.

20 Claims, 9 Drawing Sheets

(52) U.S. Cl.
CPC ...... *G03F 7/70633* (2013.01); *G03F 7/70683* (2013.01); *G03F 9/708* (2013.01); *G03F 9/7019* (2013.01)

(56) References Cited

U.S. PATENT DOCUMENTS

| | | | |
|---|---|---|---|
| 2002/0182545 A1* | 12/2002 | Minami | G03F 7/203 430/311 |
| 2003/0123039 A1* | 7/2003 | Yen | G03F 7/70141 355/68 |
| 2003/0128347 A1* | 7/2003 | Case | G03F 7/70283 355/53 |
| 2005/0219516 A1 | 10/2005 | Smith | |
| 2014/0168620 A1 | 6/2014 | Schmitt-Weaver et al. | |
| 2014/0272720 A1 | 9/2014 | Yu et al. | |

* cited by examiner

METHOD FOR TRANSFERRING A MARK PATTERN TO A SUBSTRATE, A CALIBRATION METHOD, AND A LITHOGRAPHIC APPARATUS

CROSS-REFERENCE TO RELATED APPLICATIONS

This application is the U.S. national phase entry of PCT patent application no. PCT/EP2016/064892, which was filed on Jun. 27, 2016, which claims the benefit of priority of European patent application no. 15174026.3, which was filed on Jun. 26, 2015, and which is incorporated herein in its entirety by reference.

BACKGROUND

Field of the Invention

The present invention relates to a method for transferring a mark pattern to a substrate, and to a method for calibrating a metrology tool. The invention further relates to a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Complex devices, e.g. integrated circuits, can be manufactured by arranging multiple patterned layers on top of each other, wherein each pattern is transferred to a corresponding layer with the aid of the lithographic apparatus. Although usually the patterns transferred to successive layers are different, it is important for the proper functioning of the devices to accurately position said patterns with respect to each other. Accurately positioning of said patterns with respect to each other can be done by determining the position of a previous pattern, so that a subsequent pattern can be accurately transferred based on the determined position. How well respective patterns are positioned with respect to each other is called the overlay performance.

The position of a previous pattern can be determined by measuring the position of marks which are distributed, usually evenly distributed, over the surface of the substrate. Typically, determination of the position of marks to determine the position of a previous pattern is done in the lithographic apparatus prior to exposure. The lithographic apparatus may therefore comprise a device configured to determine the position of marks, e.g. relative to a substrate holder or metrology frame.

The overlay performance can be measured by comparing the position of marks in one layer with the position of corresponding marks in another layer. The marks used to measure the overlay performance are usually not the same marks as the marks that are used for measuring the position of a previous pattern. Typically, a metrology system separate from the lithographic apparatus is used to measure the overlay performance.

In order to accurately measure the position of marks on a substrate, e.g. to determine the position of a previous pattern or to determine the overlay performance, the lithographic apparatus and/or metrology system need to be calibrated regularly, for instance after a start-up or maintenance operation, but also in order to compensate for any drift occurring over time. Calibration is preferably performed using substrates with marks provided at predefined positions.

The accuracy of the calibration is amongst others determined by the accuracy with which the marks are transferred to the predefined positions on the substrate. It has been found that the accuracy with which the marks are transferred to the substrate is limited due to random errors, such as random errors in the position of parts relative to other parts, random temperature variations, random pressure variations, etc., present in the lithographic apparatus. The random errors may manifest itself during exposure, positioning of the substrate on a substrate holder, aligning the substrate with a patterning device, etc., thereby resulting in a limited accuracy with which the marks are transferred to the substrate.

To reduce the influence of the random errors on the calibration process of the lithographic apparatus and/or the metrology system, multiple substrates may be used and measured by the lithographic apparatus or metrology system to average the results and thus average out the random errors. However, measuring multiple substrates requires a lot of time and may thus have a negative impact on throughput.

SUMMARY

It is desirable to provide a substrate with marks that are positioned at a predefined position on the substrate with increased accuracy. It is further desirable to improve calibration methods which make use of substrates provided with marks.

According to an embodiment of the invention, there is provided a method comprising:
  a) providing a reference substrate with a first mark pattern;
  b) providing the reference substrate with a first resist layer on the reference substrate, wherein the first resist layer has a minimal radiation dose needed for development of the first resist;
  c) using a reference patterning device to impart a radiation beam with a second mark pattern in its cross-section to form a patterned radiation beam; and
  d) exposing a target portion of the first resist layer of the reference substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two.

According to another embodiment of the invention, there is provided a method for calibrating a metrology tool, wherein a reference substrate is made using the method according to claim 5, wherein the first mark pattern and the second mark pattern have been positioned on the reference substrate in accordance with a predefined relative position between the first and second mark pattern, and wherein the metrology tool is calibrated by measuring the relative position between the first and second mark pattern and comparing the measured relative position with the predefined relative position.

According to a further embodiment of the invention, there is provided a method for producing a production substrate, said method comprising:
  a) providing the production substrate with a first mark pattern;
  b) providing the production substrate with a resist later on the production substrate, wherein the resist layer had a minimal radiation dose needed for development of the resist;
  c) imparting a radiation beam with a pattern including a second mark pattern in its cross section to form a patterned radiation beam;
  d) exposing a target portion of the resist later to said patterned radiation beam to create exposed areas in the target portion of the resist layer in accordance with the pattern that have been subjected to a radiation dose below the minimal radiation dose of the resist layer;
  e) determining a relative position of the first mark pattern relative to the second mark pattern;
  f) determining process corrections to compensate for deviations between the determined relative position and a desired relative position;
  g) exposing the target portion of the resist layer to the patterned radiation beam taking into account the determined process corrections to create exposed areas in the target portion of the resist layer in accordance with the pattern that have been subjected to an accumulated radiation dose that is above the minimal radiation dose of the resist layer.

According to yet another embodiment of the invention, there is provided a lithographic apparatus configured to carry out the method according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
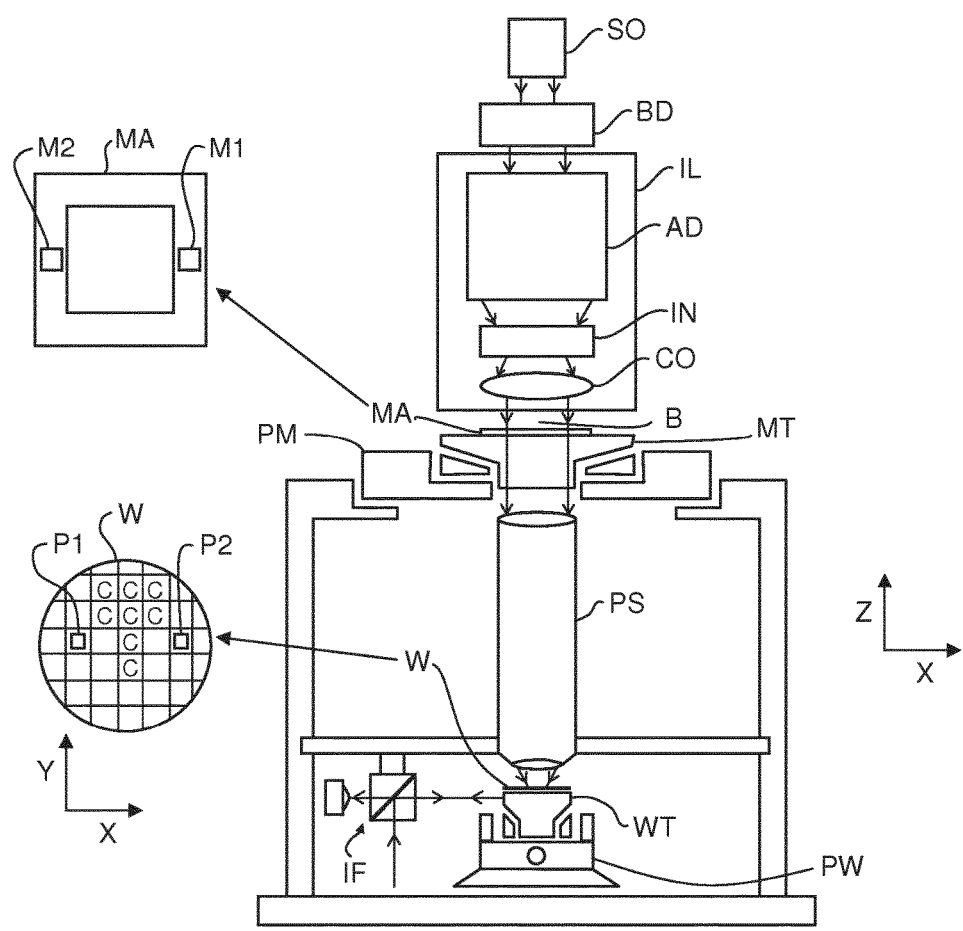
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The substrates used with the lithographic apparatus of FIG. 1 may be provided with one or more marks, such as for instance the substrate alignment marks P1, P2. With the aid of said marks the substrate may be aligned with respect to a patterning device, the position of the target portions C may be determined and/or the overlay performance may be determined, i.e. the accuracy with which successive patterns are positioned on top of each other, using the lithographic apparatus and/or a separate appropriate metrology system.

Figure 2:
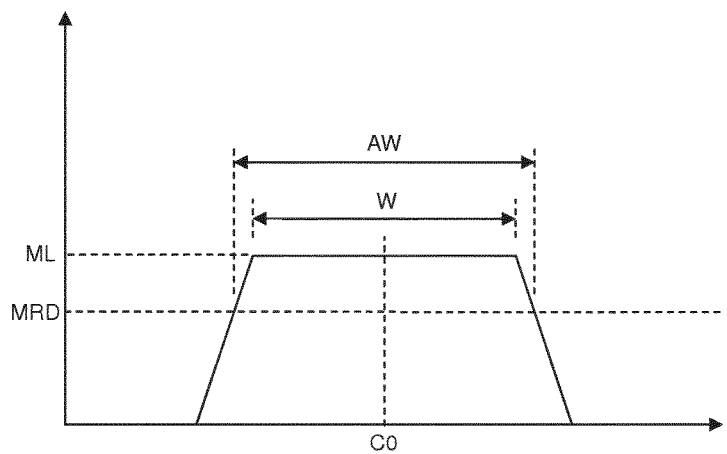
FIG. 2 depicts a radiation dose result of a prior art method for transferring a mark pattern to a resist layer.

The marks are typically transferred to the substrate using the lithographic apparatus. To transfer a mark pattern to a substrate, prior art methods use a substrate with a resist layer provided on the substrate, wherein the resist layer has a minimal radiation dose needed for development of the resist. A radiation beam is then imparted with a mark pattern in its cross-section to form a patterned radiation beam. A target portion on the resist layer is exposed once to the patterned radiation beam to create exposed areas in the target portion of the resist layer that have been subjected to a radiation dose above the minimal radiation dose. An example of by the resist layer received radiation dose as a function of substrate position is illustrated in FIG. 2 by a radiation dose curve, wherein the horizontal axis represents the position on a substrate in a single direction and the vertical axis represents the radiation dose level. The dashed line MRD indicates the minimal radiation dose of the resist layer needed for development.

The radiation dose curve of FIG. 2 depicts a single line having a width W, which single line may be part of a line pattern containing multiple lines, e.g. in the form of a grid or grating. In this case, the position of the exposed area corresponds to the position of the line to be transferred to the substrate. The opposite, wherein the position of the line to be transferred to the substrate corresponds to the position of a non-exposed area, is also conceivable.

Subjecting different areas with different radiation doses may be done by imparting a radiation beam with a corresponding pattern such that there are sharp transitions between radiated areas and non-radiated areas which has the advantage that the width of the line pattern is independent of the actual received radiation dose as long as the radiation dose of the irradiated areas is above the minimal radiation dose. However, in practice, such sharp transitions are not possible and the radiation dose will gradually change from a maximum radiation dose level ML to substantially zero as shown in FIG. 2. In FIG. 2, the gradual change is depicted as a straight line, but other gradual changes may also apply, e.g. gradual changes that are also continuous functions for higher order derivatives.

As a result of the gradual changing radiation dose curve, the actual width AW may be different from the intended width W and depends on the maximum radiation dose level ML. However, due to the repeatable nature of the exposure process, it is possible to compensate for the difference between width W of the area receiving the maximum radiation dose level ML and the actual width AW of the area receiving a radiation dose above the minimal radiation dose MRD by exposing the resist layer each time with the same predetermined maximum radiation dose and adjusting the pattern imparted to the radiation beam, so that the actual width AW corresponds to the intended width.

After transferring a mark pattern to the resist layer, the resist layer is developed. Development includes the removal of the resist layer at either the irradiated or non-irradiated areas while the other of the two areas remain occupied by the resist layer. This allows to selectively remove material or to cover the substrate including remaining resist portions with a layer of material. Finally, the resist portions, including any material provided onto these portions if present, are removed thereby, leaving a pattern corresponding to the mark pattern in the substrate.

When later on the position of the line pattern is determined, it will effectively determine the position of a centre C0 of the line pattern, which position is independent of the actual width AW of the line pattern as long as the radiation dose curve is symmetrical. However, when the line pattern is shifted in position along the substrate due to processing effects and/or random errors in the lithographic apparatus, the impact on the measured position of the centre C0 is clear as the position of the centre C0 shifts along with the line pattern.

In order to increase the accuracy of the lithographic apparatus, it may therefore be relevant to determine the required process corrections to compensate for the shift in position of the mark pattern. Process corrections may be determined by measuring the position of the mark pattern on a substrate relative to a reference, which may be another mark pattern on the substrate—e.g. in another layer of the substrate—, determine the required process corrections, and use these process corrections for subsequent substrates.

However, in some situations, previous substrates are not available to determine the required process corrections or the exposure is so critical that process corrections based on previous substrates are not sufficient. In that case, the substrate is currently exposed twice, first to determine the process corrections, and then after rework of the substrate a second time with the optimal process corrections. Rework of the substrate means that the resist layer used for the first exposure is removed entirely and a new resist layer is provided on the substrate for the second exposure. However, it may be possible that after rework, the required process corrections have changed, for instance due to the processing influence of the rework, differences in the resist layer, exposure noise, measurement noise, etc.

In order to avoid rework of the substrate, it is therefore proposed to expose the substrates with a radiation dose below a minimal radiation dose needed for development of the used resist, determine the process corrections and expose again with the determined process corrections to create exposed areas that have been subjected to an accumulated radiation dose above the minimal radiation dose. This will be explained in more detail with reference to FIGS. 3A and 3B.

Figure 3A:
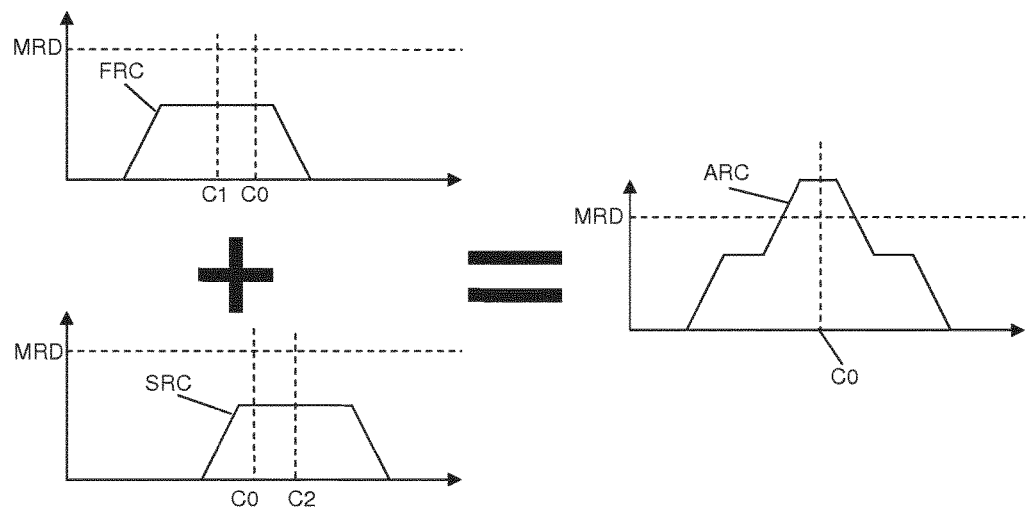
FIG. 3A depicts a radiation dose result of a method for transferring a pattern to a resist layer according to an embodiment of the invention.

FIG. 3A depicts a radiation dose result of a method to transfer a mark pattern to a substrate according to an embodiment of the invention.

A substrate is provided with a resist layer having a minimal radiation dose MRD needed for development. A radiation beam of a lithographic apparatus, e.g. the apparatus of FIG. 1, is imparted with a mark pattern.

At the top left corner of FIG. 3A, a first radiation dose curve FRC depicting the by the resist layer received radiation dose as a function of substrate position is shown. The first radiation dose curve FRC is similar to the one shown in FIG. 2 for simplicity reasons. The first radiation dose curve corresponds to a line having a centre C1. It is intended to transfer the line pattern to the resist layer such that the centre C1 is located at a desired position indicated by C0. However, due to e.g. processing effects and/or random errors in the lithographic apparatus, the centre C1 may not be transferred to the desired position C0.

The difference between centre C1 and the desired position indicated by C0 can be determined, for instance when another mark pattern is already available on the substrate to act as reference. It is also possible that the other mark pattern corresponds to the desired position C0, for instance when the overlay between a previous layer of features including the other mark pattern and the currently made layer is critical.

It is specifically noted that exposure of the target portion of the resist layer has been carried out with a radiation dose below the minimal radiation dose of the resist layer, as can clearly be seen in the top left corner curve of FIG. 3A. Hence, there are no exposed areas that have been subjected to a radiation dose above the minimal radiation dose of the resist layer, so that the resist layer is not ready for development of the resist yet.

By determining the relative position of centre C1 with respect to the desired position CO, it is possible to calculate a second exposure to compensate for the deviation between C1 and CO. An example of such a second exposure is shown in the lower left corner of FIG. 3A. The lower left corner of FIG. 3A depicts a second radiation curve SRC as function of substrate position. The position of a centre C2 of the second radiation curve SRC relative to the desired position C0 is chosen deliberately opposite the relative position of centre C1 with respect to the desired position CO to compensate for the deviation.

Again, the exposure of the target portion of the resist layer has been carried out with a radiation dose below the minimal radiation dose of the resist layer. However, the radiation doses of the first and second exposure are such that the combined exposures results in exposed areas in the target portion of the resist layer that have been subjected to an accumulated radiation dose that is above the minimal radiation dose of the resist layer. The accumulated radiation dose after exposing with a radiation dose in accordance with the first radiation curve and a radiation dose in accordance with the second radiation curve is shown is shown on the right side of FIG. 3 as accumulated radiation dose ARC.

The accumulated radiation dose ARC has an area in which the accumulated radiation dose is above the minimal radiation dose MRD. This area now has a centre substantially coinciding with the desired position C0.

Figure 3B:
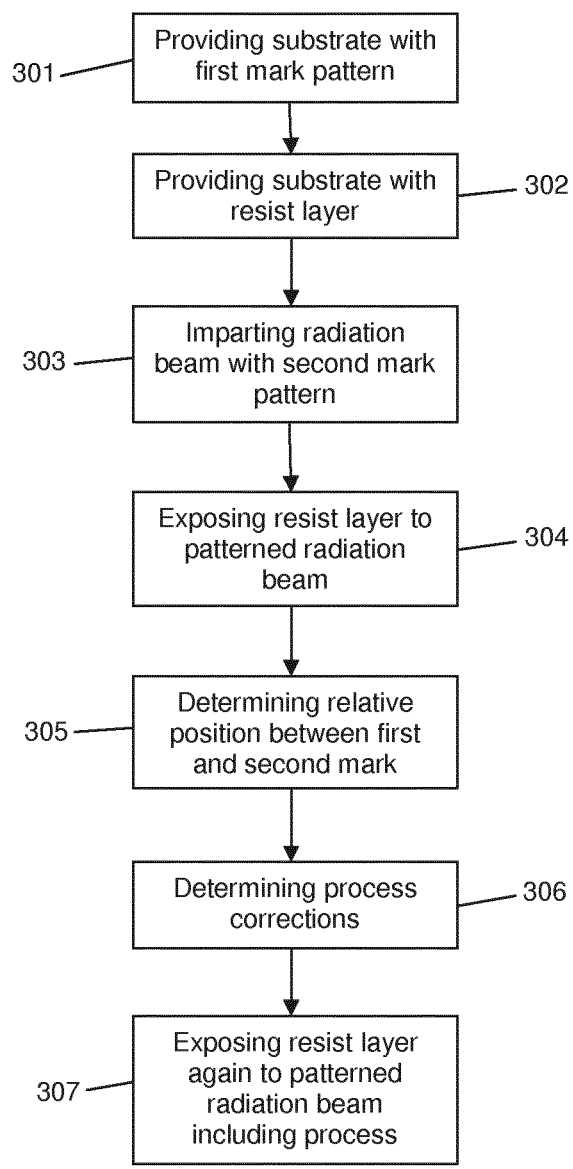
FIG. 3B depicts a flow diagram of a method according to an embodiment of the invention associated with FIG. 3A.

Reference is now made to FIG. 3B in which the method described above is summarized by a flow diagram comprising the steps of:
a) providing a substrate with a first mark pattern (step 301);
b) providing the substrate with a resist layer on the substrate, wherein the resist layer has a minimal radiation dose needed for development of the resist (step 302);
c) imparting a radiation beam with a pattern including a second mark pattern in its cross section to form a patterned radiation beam (step 303);
d) exposing a target portion of the resist layer to said patterned radiation beam to create exposed areas in the target portion of the resist layer in accordance with the pattern that have been subjected to a radiation dose FRC below the minimal radiation dose MRD of the resist layer (step 304);
e) determining a relative position C1-C0 of the first mark pattern relative to the second mark pattern (step 305);
f) determining process corrections to compensate for deviations C1-C0 between the determined relative position and a desired position (step 306);
g) exposing the target portion of the resist layer to the patterned radiation beam taking into account the determined process corrections to create exposed areas in the target portion of the resist layer in accordance with the second pattern that have been subjected to an accumulated radiation dose ARC that is above the minimal radiation dose MRD (step 307).

The first and second exposure in FIG. 3A were carried out using substantially equal radiation doses, but other ratios between the radiation dose of the first and second exposure may also be used, e.g. radiation dose of the second exposure is ⅓ of the radiation dose used for the first exposure, as long as the accumulated radiation dose is above the minimal radiation dose.

In an embodiment, the exposed areas after the first exposure have been subjected to a radiation dose of at least 50% of the minimal radiation dose of the resist layer, preferably about 75% of the minimal radiation dose of the resist layer. Preferably, the radiation dose of the first exposure before determining the process corrections is sufficiently high so that the position of the mark pattern in the resist layer can be measured relative to the reference.

The substrate may be a production substrate, meaning that the substrate may be processed further for producing integrated circuits, devices or other functional elements that can be used by and sold to third parties, i.e. the pattern transferred to the resist layer also includes device features.

An advantage of the described method is that no rework is required, resulting in an improved accuracy of the corrections, because the processing effects and random exposure noise in the first exposure are not changed by a full rework of the substrates.

It is also possible to add a third exposure, meaning that the resist layer is exposed a first time with a radiation dose below the minimal radiation dose, process corrections are determined and a second exposure is carried out taking into account the process corrections such that the accumulated radiation dose after the second exposure is still below the minimal radiation dose, again process corrections are determined and finally a third exposure is carried out taking into account the process corrections determined after the second exposure, wherein the accumulated radiation dose after the third exposure is above the minimal radiation dose for development. The first, second and third exposure all relate to the same pattern.

In embodiments, this method can be extended to include a fourth, fifth or even more exposures. The method than iteratively results in a correct positioning of the pattern on the substrate.

When more than two exposures are used as described above, the first exposure preferably has a radiation dose that is sufficiently high so that the position of the mark pattern in the resist layer can be measured relative to the reference. The radiation doses of the subsequent exposures may then be lower as long as the last exposure results in an accumulated radiation dose above the minimal radiation dose of the resist layer. Alternatively, the radiation dose of the first exposure is not sufficiently high, but multiple exposures are performed until the accumulated radiation dose is sufficient for measuring the position of the mark pattern in the resist layer relative to the reference for determining the process corrections and then one or more exposures based on process corrections are carried out.

According to another aspect of the invention, substrates provided with a first mark pattern may be used as a reference for monitoring, test purposes, setup, and matching of sensors or metrology tools. Ideally a single reference substrate is used, but for flexibility and logistics reasons, multiple similar reference substrates are used. However, in practice it is difficult to manufacture equal reference substrates, so that substrate-to-substrate variations exist. This has an negative influence on the obtainable accuracy of the lithographic apparatus or metrology tool.

Hence, it is proposed to use a substrate with a first mark pattern as a reference substrate of choice, which substrate will be referred to as master substrate. Other reference substrates can then be compared with the master substrate and any deviations can then be saved in a data file to be used as correction for the corresponding reference substrate to make them virtually equal and matched to the master substrate.

Figure 4A:
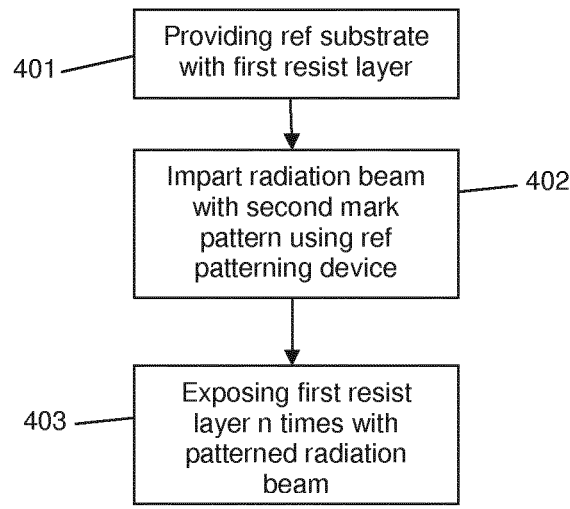
FIG. 4A depicts schematically a flow diagram of a method according to a further embodiment of the invention.

The starting point is then that we have a reference substrate with a first mark pattern and that we have a master substrate with the same first mark pattern. To compare the two substrates the following steps need to be carried out with respect to the reference substrate as schematically illustrated in FIG. 4A:
providing the reference substrate with a first resist layer on the reference substrate, wherein the first resist layer has a minimal radiation dose needed for development of the first resist (step 401);
using a reference patterning device to impart a radiation beam with a second mark pattern in its cross-section to form a patterned radiation beam (step 402); and
exposing a target portion of the first resist layer of the reference substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two (step 403).

Figure 4B:
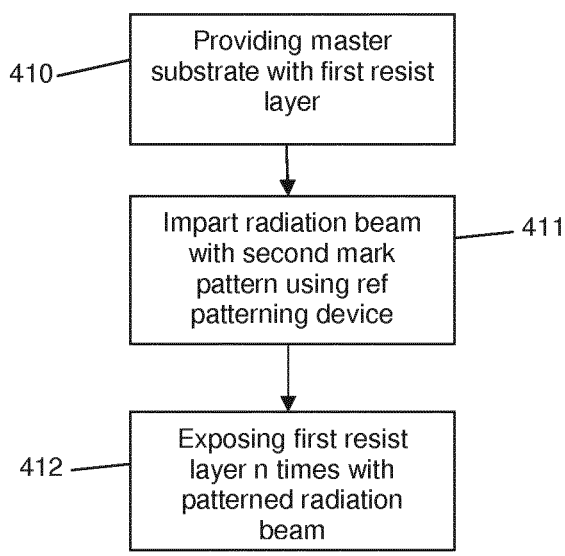
FIG. 4B depicts schematically a flow diagram of a method according to yet another embodiment of the invention.

To compare the two substrates the following steps need to be carried out with respect to the master substrate as illustrated schematically in FIG. 4B:
providing the master substrate with a first resist layer on the master substrate, wherein the first resist layer has a minimal radiation dose needed for development of the first resist (step 410);
using the reference patterning device to impart a radiation beam with the second mark pattern in its cross-section to form a patterned radiation beam (step 411); and
exposing a target portion of the first resist layer of the master substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two (step 412).

By exposing the reference and master substrates multiple times, the second mark pattern in the resist layer is positioned more accurately as will be explained with reference to FIGS. 5 and 6A-6B below.

Figure 5:
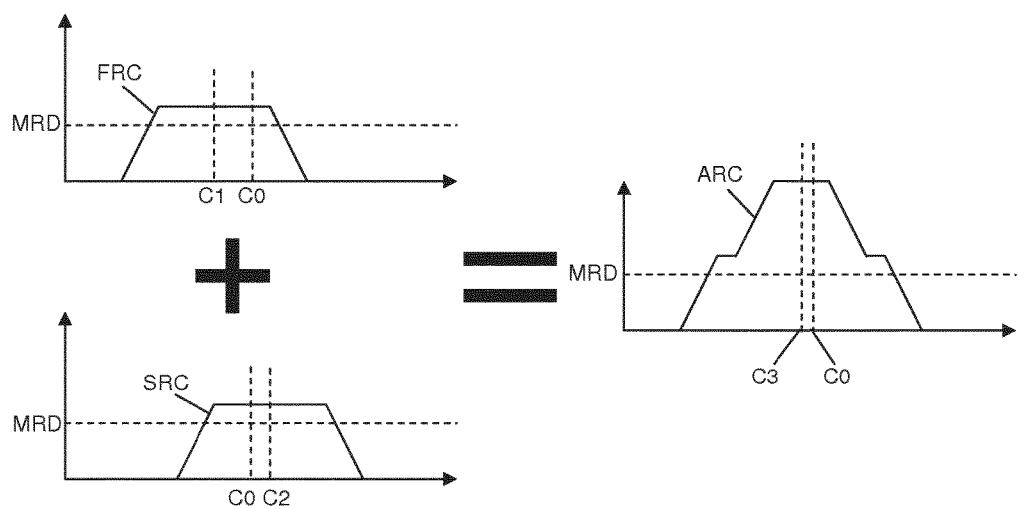
FIG. 5 depicts a radiation dose result of a method for transferring a mark pattern to a resist layer according to another embodiment of the invention.

FIG. 5 depicts a radiation dose result of a method to transfer a mark pattern to a substrate according to an embodiment of the invention.

A substrate is provided with a resist layer having a minimal radiation dose MRD needed for development. A radiation beam of a lithographic apparatus, e.g. the apparatus of FIG. 1, is imparted with a mark pattern.

At the top left corner of FIG. 5, a first radiation dose curve FRC depicting the by the resist layer received radiation dose as a function of substrate position is shown. The first radiation dose curve FRC is similar to the one shown in FIG. 2 for simplicity reasons. The first radiation dose curve corresponds to a line having a centre $C1$. It is intended to transfer the line pattern to the resist layer such that the centre $C1$ is located at a desired position indicated by $C0$. However, due to e.g. random errors in the lithographic apparatus, the centre $C1$ may not be transferred to the desired position $C0$.

In a method according to the invention, as described above, a target portion of the resist layer is exposed multiple times to the same patterned radiation beam, wherein it is intended each time to transfer the pattern to the same location, in the case of FIG. 5 to desired position $C0$. Due to random errors in the lithographic apparatus, the position of the centre of the line pattern may vary between subsequent exposures. By exposing the resist layer multiple times, the resulting final pattern in the resist layer will have a centre which is preferably an average of the centers corresponding to the individual exposures or at least closer to the desired position than in general would be the case with a single exposure, thereby reducing the influence of the random errors.

In a more mathematical manner, it can be said that in a method according to the invention, a target portion of the resist layer is exposed n times to the patterned radiation beam, wherein n is an integer with a value of at least two.

As an example, a second radiation dose curve SRC is shown in the lower left corner of FIG. 5 which relates to a second exposure. Due to random errors in the lithographic apparatus, the line has a centre $C2$ at a different position than centre $C1$ and which is also not located at the desired position $C0$. However, adding the radiation dose distribution of the first exposure to the radiation dose distribution of the second exposure results in an accumulated radiation dose curve ARC, which is shown to the right of FIG. 5. The accumulated radiation dose curve has an area in which the accumulated radiation dose is above the minimal radiation dose. The centre $C3$ of this area can be measured and can be used for calibration purposes. As the resist layer is exposed twice, the position of the centre $C3$ is an average of the position of the centers $C1$ and $C2$, which centre $C3$ will most of the time be closer to the desired position $C0$ than any of the individual centers $C1$ and $C2$.

Averaging multiple exposures has several advantages. Averaging using single exposed target portions is only possible using multiple substrates and measuring each substrate. By already averaging on a single substrate, less substrates are required to obtain the same level of accuracy of calibration, which means that less measurements need to be performed and thus less time is required for calibration. This advantage has a huge impact on production capacity as during some calibrations the lithographic apparatus may be unavailable for production. Less calibration time may thus increase the production capacity.

Another advantage is that the accuracy of calibration can be improved compared to a situation in which as many substrates are used and measured, but in which the marks are transferred in a single exposure. In the situation represented by FIG. 5 twice as much exposures are used for calibration which normally results in a $\sqrt{2}$ improvement in accuracy compared to the same calibration using substrates to which marks are transferred in a single exposure.

In FIG. 5, the maximum radiation dose of the individual exposures (i.e. the maximum radiation dose of both FRC and SRC) is above the minimum radiation dose MRD. This has the advantage that the method can easily be applied to existing lithographic apparatus without having to alter the radiation dose and thus influencing the operating properties of the lithographic apparatus, e.g. lens heating, illumination settings, etc.

Alternatively, the maximum radiation dose of each exposure may be below the minimum radiation dose MRD as long as the accumulated radiation dose has a portion above the minimal radiation dose. This situation can be obtained by using a resist layer having a higher minimal radiation dose or by lowering the maximum radiation dose of each exposure.

Figure 6A:
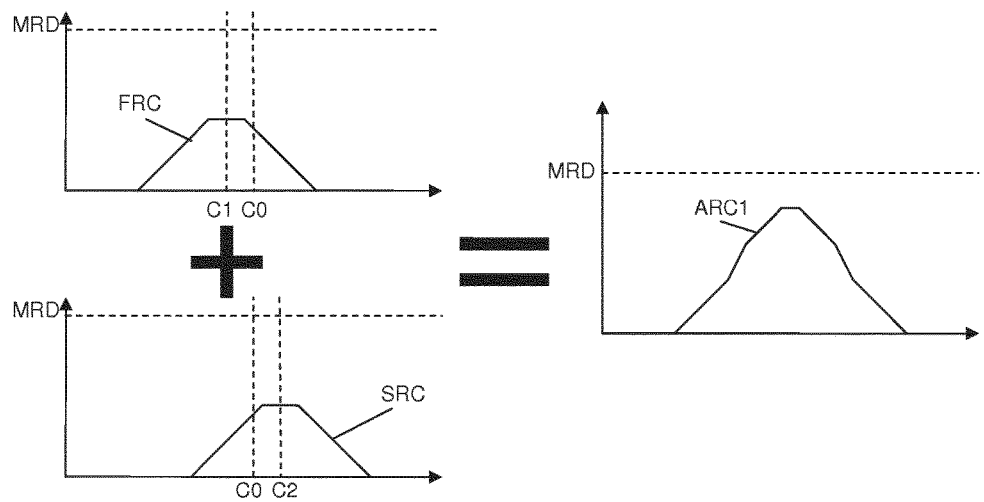
FIGS. 6A and 6B depict a radiation dose result of a method for transferring a mark pattern to a resist layer according to yet another embodiment of the invention.
Figure 6B:
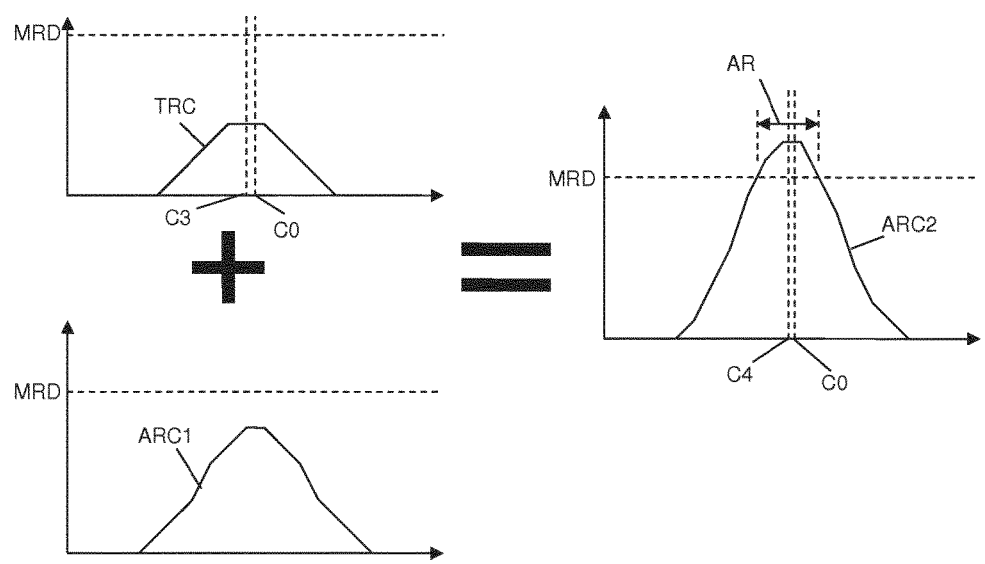

It will be apparent for the skilled person that it is also possible to use more than two exposures as will also be explained in relation to FIGS. 6A and 6B. However, in cases using more than two exposures, it is preferred that only the last exposure results in exposed areas on a substrate being subjected to an accumulated radiation dose above the minimal radiation dose MRD, i.e. in said preferred embodiment the radiation dose of the last exposure is required to form exposed areas on the substrate which have received an accumulated radiation dose above the minimal radiation dose and prior to the last exposure no area has received an accumulated radiation dose above the minimal radiation dose yet. In that way, each exposure is weighed substantially the same in the averaging process, which gives the best results.

What is done in between two exposures determines the random errors that contribute to the random positioning of the pattern. If nothing is done and the multiple exposures (steps 403 and/or 412 in respectively FIGS. 4A and 4B) are carried out directly after each other, only random errors in the exposure process are taken into account.

In an embodiment, the method may also comprise a step 422 (see FIG. 7) in between exposures in which the substrate is aligned to the patterned radiation beam, so that the random errors in the alignment step also contribute to the random errors in transfer of the mark pattern.

Figure 7:
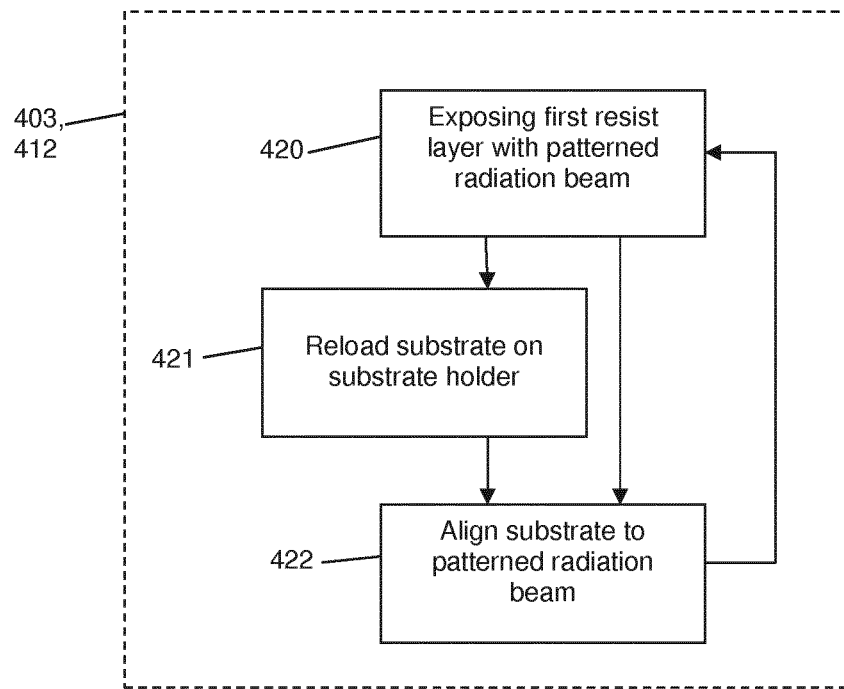
FIG. 7 depicts a possible embodiment of the steps 403 and/or 412 of respectively FIGS. 4A and 4B.

Alternatively or additionally, as indicated in FIG. 7, in an embodiment, the method may also comprise a step 421 (see FIG. 7) in between exposures in which the substrate is removed, i.e. unloaded, from a substrate holder and positioned, i.e. loaded, on the substrate holder again, thereby also taking into account the loading errors in the random errors.

Figure 8:
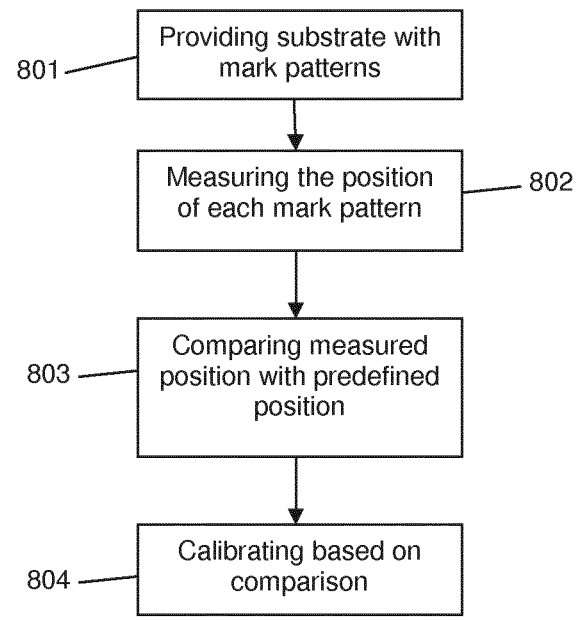
FIG. 8 depicts schematically a flow diagram of a calibration method according to an embodiment of the invention.

The substrates with mark patterns transferred to the substrate using a method according to the invention can be used to calibrate a device, e.g. a device which is part of the lithographic apparatus and is configured to determine a position of a mark on a substrate, for instance relative to a substrate holder, or a separate metrology system configured to measure the overlay performance of a lithographic apparatus by measuring the position of a mark in one layer relative to the position of a mark in another layer. A possible calibration method as illustrated in FIG. 8 includes at least:
  providing a substrate with mark patterns at predefined positions on the substrate (step 801), wherein the mark patterns are transferred to the substrate using the method according to the invention;
  measuring the position of each mark pattern (step 802),
  comparing the measured position of each mark pattern with the predefined position of said mark pattern (step 803),
  calibrating the device based on the comparison between the measured position and the predefined position of the mark patterns (step 804).

With these calibration methods, a metrology system can be calibrated for a specific configuration of the lithographic apparatus, and deviations, e.g. due to drift, from the specific configuration can subsequently be detected/monitored by measuring the substrates. By calibrating devices within the lithography apparatus, the deviations may be counteracted and the specific configuration may be restored.

FIGS. 6A and 6B depict a radiation dose result of a method to transfer a mark pattern to a substrate according to another embodiment of the invention. In this method the resist layer has a minimal radiation dose MRD needed for development of the resist layer. A radiation beam is imparted with a mark pattern in its cross-section to form a patterned radiation beam. A target portion of the resist layer is subsequently exposed to the patterned radiation beam. The resulting received radiation dose is shown in FIG. 6A at the top left corner for a one-dimensional simplified case, in which a first radiation curve FRC indicates the received radiation dose as a function of substrate position. Also shown in this graph is the minimal radiation dose MRD needed for development of the resist layer. As can be clearly seen, a single exposure is not sufficient to get above the minimal radiation dose MRD.

The pattern corresponding to the first radiation curve is a simple line having a centre C1. It is intended during this exposure and any subsequent exposure to position the centre C1 at a desired position C0. Due to e.g. random errors in the lithographic apparatus, the centre C1 is not exactly positioned at desired position C0.

The resist layer is subsequently exposed again to the same patterned radiation beam. Ignoring any previously received radiation doses, the radiation dose received during the second exposure is shown at the bottom left corner of FIG. 6A, in which a second radiation curve SRC similar to the first radiation curve indicates the received radiation dose as a function of substrate position. The pattern corresponding to the second radiation curve is a simple line having a centre C2. It is intended during the second exposure to position the centre C2 at the desired position C0, but due to e.g. random errors in the lithographic apparatus, the centre C2 is not positioned exactly at desired position C0 and at a different position than centre C1 of the first exposure.

The two exposures result in an accumulated radiation dose as depicted to the right of FIG. 6A as a first accumulated radiation curve ARC1.

The resist layer is subsequently exposed a third time to the same patterned radiation beam with the intention to position a centre C3 at a desired position C0 as shown at the top left corner of FIG. 6B in which a third radiation curve TRC indicates the received radiation dose as function of substrate position during the third exposure. As can be clearly seen, the centre C3 is positioned differently from the other exposures due to random errors.

The radiation dose adds up to the accumulated radiation dose ARC1 of the first two exposures as depicted in the bottom left corner of FIG. 6B. The result is a second accumulated radiation curve ARC2 as shown to the right of FIG. 6B. After being exposed the third time, there is an exposed area AR of resist on the substrate which received a radiation dose above the minimal radiation dose MRD. The centre C4 of this area AR is the average of the three centers C1-C3. As can be seen from the right part of FIG. 6B, the influence of the random errors for each individual exposure is reduced and a center position C4 of the mark pattern is obtained which is closer to the desired position C0 than the center positions that would have been obtained after an individual exposure.

Hence, due to the multiple exposures, both the reference substrate and the master substrate have been provided with a second mark pattern that is positioned at or near the desired position such that it can be used as a reference for both substrates.

Subsequently, a first relative position of the first mark pattern in the reference substrate relative to the second mark pattern in the first resist layer of the reference substrate is determined, and a second relative position of the first mark pattern in the master substrate relative to the second mark pattern in the first resist layer of the master substrate is determined. Substrate error correction data can then be determined by determining a difference between the first relative position and the second relative position. This error correction data can be used to correct the position of the first mark pattern in the reference substrate, so that it corresponds to the position of the first mark pattern of the master substrate. In this way many reference substrates can be made with corresponding substrate error correction data to be in conformity with the master substrate.

In the situation that multiple reference patterning devices are used for monitoring, test purposes, and setup of the lithographic apparatus, similar variations may exist between the different reference patterning devices. This has a negative influence on the obtainable accuracy of the lithographic apparatus or metrology tool.

To improve this, it is proposed to use a reference substrate with a first mark pattern thereon and to transfer a second mark pattern to a resist layer on the reference substrate using a reference patterning device and to transfer a third mark pattern to the same resist layer on the reference substrate using a master patterning device which will act as a reference of choice. By comparing the position of the second mark pattern relative to the first mark pattern with the position of the third mark pattern relative to the first mark pattern, patterning device error correction data can be determined to correct deviations between the reference patterning device and the master patterning device.

The second and third mark pattern are transferred to the resist layer by exposing the target portion of the resist layer of the reference substrate multiple times as described above with respect to FIG. 5 and FIGS. 6A and 6B.

In an embodiment, the third and second mark pattern are equal to each other.

Figure 9:
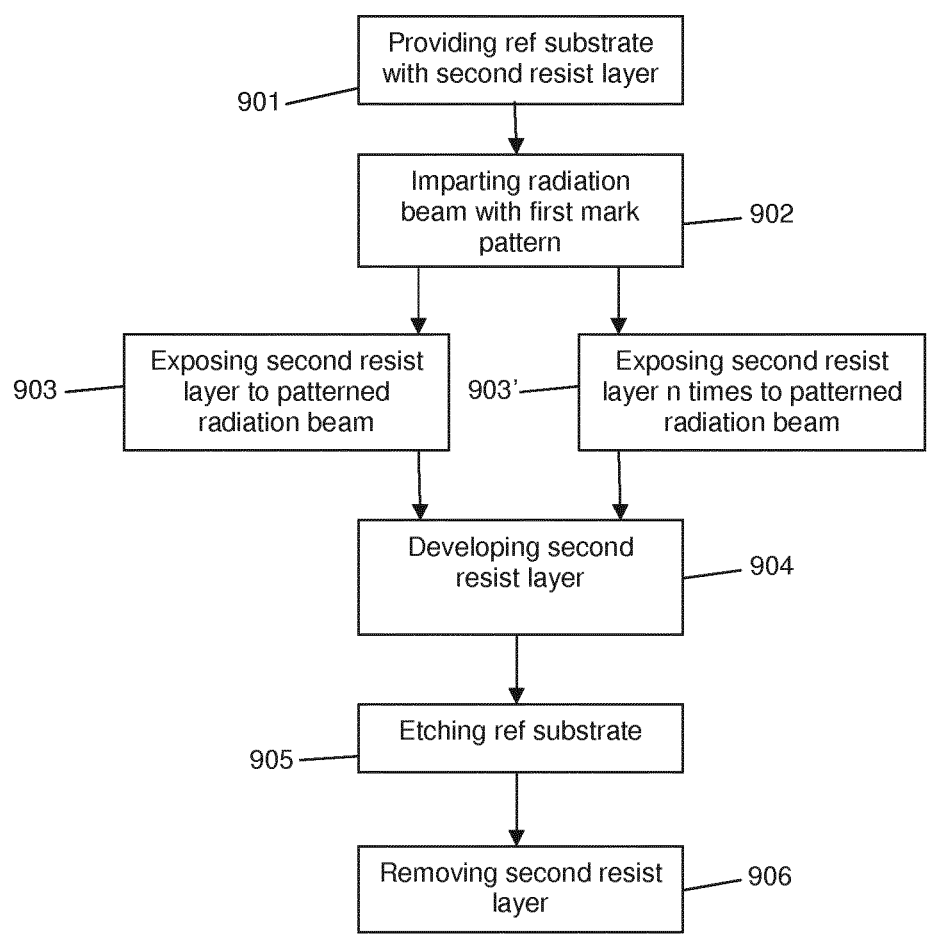
FIG. 9 depicts schematically a flow diagram of a method according yet another embodiment of the invention.

The first mark pattern on the reference substrates may for instance be made using the following method as illustrated in FIG. 9:

providing the reference substrate with a second resist layer on the reference substrate, wherein the second resist layer has a minimal radiation dose needed for development of the second resist (step 901);

using a first patterning device to impart a radiation beam with a first mark pattern in its cross section to form a patterned radiation beam (step 902);

exposing a target portion of the second resist layer of the reference substrate to said patterned radiation beam to create exposed areas in the target portion of the second resist layer in accordance with the first mark pattern that have been subjected to a radiation dose above the minimal radiation dose of the second resist layer (step 903);

developing the second resist layer of the reference substrate (step 904);

etching the reference substrate to remove substrate material in accordance with the first mark pattern (step 905); and removing the second resist layer still present on the reference substrate (step 906).

To improve the accuracy of the reference substrate, multiple exposures may be used as described above for the second and third mark pattern, so that the third step 903 may be replaced by a step 903' which is shown in FIG. 9 as a optional route next to the one described above:

exposing a target portion of the second resist layer of the reference substrate n times to said patterned radiation beam to create exposed areas in the target portion of the second resist layer in accordance with the first mark pattern that have been subjected to an accumulated radiation dose above the minimal radiation dose of the second resist layer, wherein n is an integer with a value of at least two.

Figure 10:
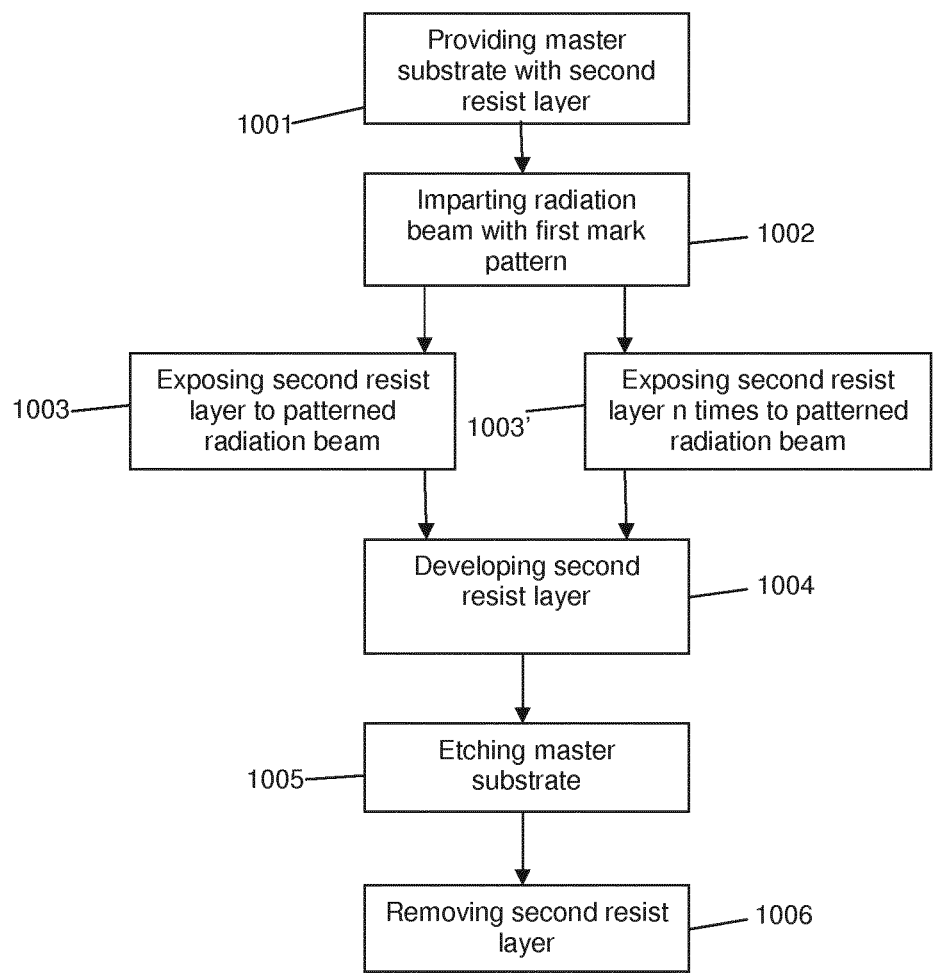
FIG. 10 depicts schematically a flow diagram of a method according to yet a further embodiment of the invention.

The first mark pattern on the master substrate may for instance be made using the following method as illustrated in FIG. 10:

providing the master substrate with a second resist layer on the master substrate, wherein the second resist layer has a minimal radiation dose needed for development of the second resist (step 1001);

using a first patterning device to impart a radiation beam with a first mark pattern in its cross section to form a patterned radiation beam (step 1002);

exposing a target portion of the second resist layer of the master substrate to said patterned radiation beam to create exposed areas in the target portion of the second resist layer in accordance with the first mark pattern that have been subjected to a radiation dose above the minimal radiation dose of the second resist layer (step 1003);

developing the second resist layer of the master substrate (step 1004);

etching the master substrate to remove substrate material in accordance with the first mark pattern (step 1005); and removing the second resist layer still present on the master substrate (step 1006).

To improve the accuracy of the master substrate, multiple exposures may be used as described above for the second and third mark pattern, so that the third step 1003 may be replaced by a step 1003' which is shown in FIG. 10 as an optional route next to the one described above:

exposing a target portion of the second resist layer of the master substrate n times to said patterned radiation beam to create exposed areas in the target portion of the second resist layer in accordance with the first mark pattern that have been subjected to an accumulated radiation dose above the minimal radiation dose of the second resist layer, wherein n is an integer with a value of at least two.

When both the first and second mark pattern of a reference substrate have been made using multiple exposures according to the invention, a predefined relative position between the two mark patterns can be incorporated into the reference substrate, so that the reference substrate can be used to calibrate a metrology tool by measuring the relative position between the first and second mark pattern with the metrology tool and comparing the measured relative position with the predefined relative position.

Although the indicated radiation doses are shown for one-dimensional situations only, it will be apparent to the person skilled in the art of lithography that the invention also applies to two-dimensional cases. The one-dimensional situations are used as they are easier to explain the principles behind the invention.

Further, a method according to the invention may also use more than three exposures, where the more exposures are used, the more the random errors are averaged out of the final position of the mark pattern. However, more exposures also takes time, so that an optimum may be chosen between the averaging advantages and the time it takes to do the n exposures.

Although the above description is mainly directed to exposing a single target portion of the resist layer, it will be apparent for the skilled person that a resist layer may have multiple target portions, as is also indicated with reference to FIG. 1. It may then be possible to transfer a mark pattern to each target portion using the method according to the invention. Preferably, only one target portion is exposed at a time, wherein each target portion eventually is exposed n times.

Exposing each target portion n times may be carried out by exposing the multiple target portion in a sequence one after the other, which sequence is repeated n times. Alternatively, each target portion is exposed n times by exposing a target portion n times and subsequently exposing the next target portion n times until all of the multiple target portion have been exposed n times.

It is explicitly noted that wherever 'first' and 'second' have been used to describe the invention, this is not an indication of order in time or place, but merely used to distinguish different features from one another.

In an embodiment, there is provided a method comprising: a) providing a reference substrate with a first mark pattern; b) providing the reference substrate with a first resist layer on the reference substrate, wherein the first resist layer has a minimal radiation dose needed for development of the first resist; c) using a reference patterning device to impart a radiation beam with a second mark pattern in its cross-section to form a patterned radiation beam; and d) exposing a target portion of the first resist layer of the reference substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two.

In an embodiment, the method further comprises: 1) providing a master substrate with the first mark pattern; 2) providing the master substrate with a first resist layer on the master substrate, wherein the first resist layer has a minimal radiation dose needed for development of the first resist; 3) using the reference patterning device to impart a radiation beam with the second mark pattern in its cross-section to form a patterned radiation beam; and 4) exposing a target portion of the first resist layer of the master substrate n times to said patterned radiation beam to create exposed areas in the target portion of the first resist layer in accordance with the second mark pattern that have been subjected to an accumulated radiation dose above the minimal radiation dose of the first resist layer, wherein n is an integer with a value of at least two; 5) determining a first relative position of the first mark pattern in the reference substrate relative to the second mark pattern in the first resist layer of the reference substrate; 6) determining a second relative position of the first mark pattern in the master substrate relative to the second mark pattern in the first resist layer of the master substrate; and 7) determining substrate error correction data by determining a difference between the first relative position and the second relative position. In an embodiment, the method further comprises: e) using a master patterning device to impart a radiation beam with a third mark pattern in its cross-section to form a patterned radiation beam; f) exposing a target portion of the first resist layer of the reference substrate n times to said patterned radiation beam to create exposed areas in the target portion of the first resist layer in accordance with the third mark pattern that have been subjected to an accumulated radiation dose above the minimal radiation dose of the first resist layer, wherein n is an integer with a value of at least two; g) determining a first relative position of the first mark pattern in the reference substrate relative to the second mark pattern in the first resist layer of the reference substrate; h) determining a third relative position of the first mark pattern in the reference substrate relative to the third mark pattern in the first resist layer of the reference substrate; and i) determining patterning device error correction data by determining a difference between the first relative position and the third relative position. In an embodiment, step a) comprises: a1) providing the reference substrate with a second resist layer on the reference substrate, wherein the second resist layer has a minimal radiation dose needed for development of the second resist; a2) using a first patterning device to impart a radiation beam with a first mark pattern in its cross section to form a patterned radiation beam; a3) exposing a target portion of the second resist layer of the reference substrate to said patterned radiation beam to create exposed areas in the target portion of the second resist layer in accordance with the first mark pattern that have been subjected to a radiation dose above the minimal radiation dose of the second resist layer; a4) developing the second resist layer of the reference substrate; a5) etching the reference substrate to remove substrate material in accordance with the first mark pattern; a6) removing the second resist layer still present on the reference substrate. In an embodiment, step a3) is replaced by: a3') exposing a target portion of the second resist layer of the reference substrate n times to said patterned radiation beam to create exposed areas in the target portion of the second resist layer in accordance with the first mark pattern that have been subjected to an accumulated radiation dose above the minimal radiation dose of the second resist layer, wherein n is an integer with a value of at least two. In an embodiment, step 1) comprises: 1.1) providing the master substrate with a second resist layer on the master substrate, wherein the second resist layer has a minimal radiation dose needed for development of the second resist; 1.2) using a first patterning device to impart a radiation beam with a first mark pattern in its cross section to form a patterned radiation beam; 1.3) exposing a target portion of the second resist layer of the master substrate to said patterned radiation beam to create exposed areas in the target portion of the second resist layer in accordance with the first mark pattern that have been subjected to a radiation dose above the minimal radiation dose of the second resist layer; 1.4) developing the second resist layer of the master substrate; 1.5) etching the master substrate to remove substrate material in accordance with the first mark pattern; 1.6) removing the second resist layer still present on the master substrate. In an embodiment, step 1.3) is replaced by: 1.3') exposing a target portion of the second resist layer of the master substrate n times to said patterned radiation beam to create exposed areas in the target pm1ion of the second resist layer in accordance with the first mark pattern that have been subjected to an accumulated radiation dose above the minimal radiation dose of the second resist layer, wherein n is an integer with a value of at least two.

In an embodiment, there is provided a method for calibrating a metrology tool, wherein a reference substrate is made using a method as described herein, wherein the first mark pattern and the second mark pattern have been positioned on the reference substrate in accordance with a predefined relative position between the first and second mark pattern, and wherein the metrology tool is calibrated by measuring the relative position between the first and second mark pattern and comparing the measured relative position with the predefined relative position.

In an embodiment, there is provided a method for producing a production substrate, said method comprising: a) providing the production substrate with a first mark pattern; b) providing the production substrate with a resist layer on the production substrate, wherein the resist layer had a minimal radiation dose needed for development of the resist; c) imparting a radiation beam with a pattern including a second mark pattern in its cross section to form a patterned radiation beam; d) exposing a target portion of the resist layer to said patterned radiation beam to create exposed areas in the target portion of the resist layer in accordance with the pattern that have been subjected to a radiation dose below the minimal radiation dose of the resist layer; e) determining a relative position of the first mark pattern relative to the second mark pattern; f) determining process corrections to compensate for deviations between the determined relative position and a desired relative position; g) exposing the target portion of the resist layer to the patterned radiation beam taking into account the determined process corrections to create exposed areas in the target portion of the resist layer in accordance with the pattern that have been subjected to an accumulated radiation dose that is above the minimal radiation dose of the resist layer.

In an embodiment, in step d) the exposed areas have been subjected to a radiation dose of at least 50% of the minimal radiation dose of the resist layer, preferably about 75% of the minimal radiation dose of the resist layer.

In an embodiment, there is provided a lithographic apparatus configured to carry out a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology system and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
   providing a reference substrate having a first mark pattern, with a first resist layer on the reference substrate, wherein the first resist layer has a minimal radiation dose needed for development of the first resist;
   using a reference patterning device to impart a radiation beam with a second mark pattern in its cross-section to form a patterned radiation beam; and
   exposing a target portion of the first resist layer of the reference substrate at least two times to the patterned radiation beam to create exposed areas in the target portion of the first resist layer in accordance with the second mark pattern that have been subjected to an accumulated radiation dose above the minimal radiation dose of the first resist layer, wherein the exposing is configured to position a resulting pattern in the first resist layer on the reference substrate closer to a desired position than would be the case with a single exposure.

2. The method according to claim 1, further comprising:
   providing a master substrate having the first mark pattern, with a first resist layer on the master substrate, wherein the first resist layer has a minimal radiation dose needed for development of the first resist;
   using the reference patterning device to impart a radiation beam with the second mark pattern in its cross-section to form a patterned radiation beam; and
   exposing a target portion of the first resist layer of the master substrate n times to the patterned radiation beam to create exposed areas in the target portion of the first resist layer in accordance with the second mark pattern that have been subjected to an accumulated radiation dose above the minimal radiation dose of the first resist layer, wherein n is an integer with a value of at least two;

determining a first relative position between the first mark pattern in the reference substrate and the second mark pattern in the first resist layer of the reference substrate;

determining a second relative position between the first mark pattern in the master substrate and the second mark pattern in the first resist layer of the master substrate; and determining substrate error correction data by determining a difference between the first relative position and the second relative position.

3. The method according to claim 2, further comprising:

providing a master substrate with a second resist layer on the master substrate, wherein the second resist layer has a minimal radiation dose needed for development of the second resist;

using a first patterning device to impart a radiation beam with a first mark pattern in its cross section to form a patterned radiation beam;

exposing a target portion of the second resist layer of the master substrate to the patterned radiation beam to create exposed areas in the target portion of the second resist layer in accordance with the first mark pattern that have been subjected to a radiation dose above the minimal radiation dose of the second resist layer;

developing the second resist layer of the master substrate;

etching the master substrate to remove substrate material in accordance with the first mark pattern; and removing the second resist layer still present on the master substrate to yield the master substrate having the first mark pattern.

4. The method according to claim 2, further comprising:

providing a master substrate with a second resist layer on the master substrate, wherein the second resist layer has a minimal radiation dose needed for development of the second resist;

using a first patterning device to impart a radiation beam with a first mark pattern in its cross section to form a patterned radiation beam;

exposing a target portion of the second resist layer of the master substrate n times to the patterned radiation beam to create exposed areas in the target portion of the second resist layer in accordance with the first mark pattern that have been subjected to an accumulated radiation dose above the minimal radiation dose of the second resist layer, wherein n is an integer with a value of at least two;

developing the second resist layer of the master substrate;

etching the master substrate to remove substrate material in accordance with the first mark pattern; and removing the second resist layer still present on the master substrate to yield the master substrate having the first mark pattern.

5. The method according to claim 1, further comprising:

using a master patterning device to impart a radiation beam with a third mark pattern in its cross-section to form a patterned radiation beam;

exposing a target portion of the first resist layer of the reference substrate n times to the patterned radiation beam to create exposed areas in the target portion of the first resist layer in accordance with the third mark pattern that have been subjected to an accumulated radiation dose above the minimal radiation dose of the first resist layer, wherein n is an integer with a value of at least two;

determining a first relative position between the first mark pattern in the reference substrate and the second mark pattern in the first resist layer of the reference substrate;

determining a second relative position between the first mark pattern in the reference substrate and the third mark pattern in the first resist layer of the reference substrate; and determining patterning device error correction data by determining a difference between the first relative position and the second relative position.

6. The method according to claim 1, further comprising:

providing a reference substrate with a second resist layer on the reference substrate, wherein the second resist layer has a minimal radiation dose needed for development of the second resist;

using a first patterning device to impart a radiation beam with a first mark pattern in its cross section to form a patterned radiation beam;

exposing a target portion of the second resist layer of the reference substrate to the patterned radiation beam to create exposed areas in the target portion of the second resist layer in accordance with the first mark pattern that have been subjected to a radiation dose above the minimal radiation dose of the second resist layer;

developing the second resist layer of the reference substrate;

etching the reference substrate to remove substrate material in accordance with the first mark pattern; and removing the second resist layer still present on the reference substrate to yield the reference substrate having the first mark pattern.

7. The method according to claim 1, further comprising:

providing a reference substrate with a second resist layer on the reference substrate, wherein the second resist layer has a minimal radiation dose needed for development of the second resist;

using a first patterning device to impart a radiation beam with a first mark pattern in its cross section to form a patterned radiation beam;

exposing a target portion of the second resist layer of the reference substrate n times to the patterned radiation beam to create exposed areas in the target portion of the second resist layer in accordance with the first mark pattern that have been subjected to an accumulated radiation dose above the minimal radiation dose of the second resist layer, wherein n is an integer with a value of at least two;

developing the second resist layer of the reference substrate;

etching the reference substrate to remove substrate material in accordance with the first mark pattern; and removing the second resist layer still present on the reference substrate to yield the reference substrate having the first mark pattern.

8. A method for calibrating a metrology tool, wherein a reference substrate is made using the method according to claim 7, wherein the first mark pattern and the second mark pattern have been positioned on the reference substrate in accordance with a predefined relative position between the first and second mark pattern, and wherein the metrology tool is calibrated by measuring the relative position between the first and second mark pattern and comparing the measured relative position with the predefined relative position.

9. A method method comprising:

providing a production substrate having a first mark pattern, with a resist layer on the production substrate, wherein the resist layer had a minimal radiation dose needed for development of the resist;

imparting a radiation beam with a pattern including a second mark pattern in its cross section to form a patterned radiation beam;

exposing a target portion of the resist layer to the patterned radiation beam to create exposed areas in the target portion of the resist layer in accordance with the pattern that have been subjected to a radiation dose below the minimal radiation dose of the resist layer;

determining a relative position between the first mark pattern and the second mark pattern;

determining process corrections to compensate for deviations between the determined relative position and a desired relative position;

exposing the target portion of the resist layer to the patterned radiation beam taking into account the determined process corrections to create exposed areas in the target portion of the resist layer in accordance with the pattern that have been subjected to an accumulated radiation dose that is above the minimal radiation dose of the resist layer.

10. The method according to claim 9, wherein the exposed areas created in exposing a target portion of the resist layer to a radiation dose below the minimal radiation dose of the resist layer have been subjected to a radiation dose of at least 50% of the minimal radiation dose of the resist layer.

11. A non-transitory computer readable medium comprising instructions configured to cause a processing device to cause at least:

provision of a reference substrate having a first mark pattern, with a first resist layer on the reference substrate, wherein the first resist layer has a minimal radiation dose needed for development of the first resist;

use of a reference patterning device to impart a radiation beam with a second mark pattern in its cross-section to form a patterned radiation beam; and exposure of a target portion of the first resist layer of the reference substrate at least two times to the patterned radiation beam to create exposed areas in the target portion of the first resist layer in accordance with the second mark pattern that have been subjected to an accumulated radiation dose above the minimal radiation dose of the first resist layer, wherein the exposing is configured to position a resulting pattern in the first resist layer on the reference substrate closer to a desired position than would be the case with a single exposure.

12. The computer readable medium according to claim 11, wherein the instructions are further configured to cause a processing device to cause:

provision of a master substrate having the first mark pattern, with a first resist layer on the master substrate, wherein the first resist layer has a minimal radiation dose needed for development of the first resist;

use of the reference patterning device to impart a radiation beam with the second mark pattern in its cross-section to form a patterned radiation beam; and exposure of a target portion of the first resist layer of the master substrate n times to the patterned radiation beam to create exposed areas in the target portion of the first resist layer in accordance with the second mark pattern that have been subjected to an accumulated radiation dose above the minimal radiation dose of the first resist layer, wherein n is an integer with a value of at least two;

determination of a first relative position between the first mark pattern in the reference substrate and the second mark pattern in the first resist layer of the reference substrate;

determination of a second relative position between the first mark pattern in the master substrate and the second mark pattern in the first resist layer of the master substrate; and determination of substrate error correction data by determining a difference between the first relative position and the second relative position.

13. The computer readable medium according to claim 12, wherein the instructions are further configured to cause a processing device to cause:

provision of a master substrate with a second resist layer on the master substrate, wherein the second resist layer has a minimal radiation dose needed for development of the second resist;

use of a first patterning device to impart a radiation beam with a first mark pattern in its cross section to form a patterned radiation beam;

exposure of a target portion of the second resist layer of the master substrate n times to the patterned radiation beam to create exposed areas in the target portion of the second resist layer in accordance with the first mark pattern that have been subjected to an accumulated radiation dose above the minimal radiation dose of the second resist layer, wherein n is an integer with a value of at least two;

development of the second resist layer of the master substrate;

etching of the master substrate to remove substrate material in accordance with the first mark pattern; and removal of the second resist layer still present on the master substrate to yield the master substrate having the first mark pattern.

14. The computer readable medium according to claim 11, wherein the instructions are further configured to cause a processing device to cause:

use of a master patterning device to impart a radiation beam with a third mark pattern in its cross-section to form a patterned radiation beam;

exposure of a target portion of the first resist layer of the reference substrate n times to the patterned radiation beam to create exposed areas in the target portion of the first resist layer in accordance with the third mark pattern that have been subjected to an accumulated radiation dose above the minimal radiation dose of the first resist layer, wherein n is an integer with a value of at least two;

determination of a first relative position between the first mark pattern in the reference substrate and the second mark pattern in the first resist layer of the reference substrate;

determination of a second relative position between the first mark pattern in the reference substrate and the third mark pattern in the first resist layer of the reference substrate; and determination of patterning device error correction data by determining a difference between the first relative position and the second relative position.

15. The computer readable medium according to claim 11, wherein the instructions are further configured to cause a processing device to cause:

provision of a reference substrate with a second resist layer on the reference substrate, wherein the second resist layer has a minimal radiation dose needed for development of the second resist;

use of a first patterning device to impart a radiation beam with a first mark pattern in its cross section to form a patterned radiation beam;

exposure of a target portion of the second resist layer of the reference substrate n times to the patterned radiation beam to create exposed areas in the target portion of the second resist layer in accordance with the first mark pattern that have been subjected to an accumulated radiation dose above the minimal radiation dose of the second resist layer, wherein n is an integer with a value of at least two;

development of the second resist layer of the reference substrate;

etching of the reference substrate to remove substrate material in accordance with the first mark pattern; and removal of the second resist layer still present on the reference substrate to yield the reference substrate having the first mark pattern.

16. The computer readable medium according to claim 11, wherein the instructions are further configured to cause a processing device to cause calibration of a metrology tool by comparison of a measurement relative position between the first and second mark pattern of the reference substrate with a predefined relative position in accordance with which the first mark pattern and the second mark pattern have been positioned on the reference substrate.

17. A lithographic system, comprising:
a support structure configured to support a patterning device configured to impart a radiation beam with a pattern;
a projection system configured to project the radiation beam toward a substrate; and
the computer readable medium according to claim 11.

18. A non-transitory computer readable medium comprising instructions configured to cause a processing device to cause at least:

provision of a production substrate having a first mark pattern, with a resist layer on the production substrate, wherein the resist layer had a minimal radiation dose needed for development of the resist;

imparting of a radiation beam with a pattern including a second mark pattern in its cross section to form a patterned radiation beam;

exposure of a target portion of the resist layer to the patterned radiation beam to create exposed areas in the target portion of the resist layer in accordance with the pattern that have been subjected to a radiation dose below the minimal radiation dose of the resist layer;

determination of a relative position between the first mark pattern and the second mark pattern;

determination of process corrections to compensate for deviations between the determined relative position and a desired relative position;

exposure of the target portion of the resist layer to the patterned radiation beam taking into account the determined process corrections to create exposed areas in the target portion of the resist layer in accordance with the pattern that have been subjected to an accumulated radiation dose that is above the minimal radiation dose of the resist layer.

19. The computer readable medium according to claim 18, wherein the exposed areas created in exposure of a target portion of the resist layer to a radiation dose below the minimal radiation dose of the resist layer have been subjected to a radiation dose of at least 50% of the minimal radiation dose of the resist layer.

20. A lithographic system, comprising:
a support structure configured to support a patterning device configured to impart a radiation beam with a pattern;
a projection system configured to project the radiation beam toward a substrate; and
the computer readable medium according to claim 18.

* * * * *